(12) United States Patent
Chung et al.

(10) Patent No.: US 9,646,558 B2
(45) Date of Patent: May 9, 2017

(54) SCAN LINE DRIVER

(71) Applicant: Samsung Display Co., Ltd., Yongin, Gyeonggi-do (KR)

(72) Inventors: Bo-Yong Chung, Suwon-si (KR); Dong-Gyu Kim, Yongin-si (KR); Hae-Yeon Lee, Bucheon-si (KR); Hai-Jung In, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/708,117

(22) Filed: May 8, 2015

(65) Prior Publication Data

US 2016/0210937 A1 Jul. 21, 2016

(30) Foreign Application Priority Data

Jan. 19, 2015 (KR) .......................... 10-2015-0008529

(51) Int. Cl.
  *G09G 3/36* (2006.01)
  *G09G 3/3266* (2016.01)
  *G11C 19/28* (2006.01)
(52) U.S. Cl.
  CPC ......... *G09G 3/3674* (2013.01); *G09G 3/3266* (2013.01); *G11C 19/287* (2013.01); *G09G 2310/0267* (2013.01); *G09G 2310/0289* (2013.01)
(58) Field of Classification Search
  None
  See application file for complete search history.

(56) References Cited

U.S. PATENT DOCUMENTS

| | | | | |
|---|---|---|---|---|
| 7,436,923 | B2* | 10/2008 | Tobita | G09G 3/3677 377/64 |
| 7,932,887 | B2* | 4/2011 | Kim | G09G 3/3677 345/100 |
| 8,040,999 | B2* | 10/2011 | Tobita | G11C 19/184 377/64 |
| 8,159,446 | B2* | 4/2012 | Lee | G09G 3/3677 345/100 |
| 8,305,326 | B2* | 11/2012 | Kim | G09G 3/3677 345/100 |
| 8,704,807 | B2* | 4/2014 | Chung | G09G 3/3266 345/100 |

(Continued)

FOREIGN PATENT DOCUMENTS

KR  10-2013-0004976 A  1/2013
KR  10-2013-0055258 A  5/2013

(Continued)

*Primary Examiner* — Dismery Mercedes
(74) *Attorney, Agent, or Firm* — Knobbe Martens Olson & Bear LLP

(57) ABSTRACT

A scan line driver is disclosed. In one aspect, the scan line driver includes a driving signal generation circuit, an output line driving circuit, and a carry transfer circuit. The driving signal generation circuit is configured to generate first and second driving signals based on a plurality of clock signals and a carry signal from a previous scan line driver. The output line driving circuit is configured to generate a scan line enable signal based on the first and second driving signals. The carry transfer circuit is configured to generate a carry signal based on the first and second driving signals.

19 Claims, 15 Drawing Sheets

(56) References Cited

U.S. PATENT DOCUMENTS

| | | | | |
|---|---|---|---|---|
| 8,830,156 B2* | 9/2014 | Kim | .................... | G09G 3/3677 345/100 |
| 8,866,799 B2* | 10/2014 | Jun | ....................... | G09G 3/36 345/204 |
| 9,013,456 B2* | 4/2015 | Chung | ................ | G09G 3/3266 345/204 |
| 9,275,593 B2* | 3/2016 | Kim | .................... | G09G 3/3677 |
| 2005/0275614 A1* | 12/2005 | Kim | .................... | G09G 3/3674 345/100 |
| 2008/0001904 A1* | 1/2008 | Kim | .................... | G09G 3/3677 345/100 |
| 2008/0036725 A1* | 2/2008 | Lee | .................... | G09G 3/3677 345/100 |
| 2008/0136756 A1* | 6/2008 | Yeo | .................... | G09G 3/3677 345/87 |
| 2010/0111245 A1* | 5/2010 | Tobita | .................... | G11C 19/28 377/64 |
| 2010/0225621 A1* | 9/2010 | Jung | .................... | G09G 3/3677 345/204 |
| 2013/0249884 A1* | 9/2013 | Kim | .................... | G09G 3/3677 345/212 |
| 2015/0287376 A1* | 10/2015 | Lim | .................... | G09G 3/3677 345/92 |

FOREIGN PATENT DOCUMENTS

| | | | |
|---|---|---|---|
| KR | 10-2013-0107528 A | 10/2013 | |
| KR | 10-2014-0042308 A | 4/2014 | |

* cited by examiner

INITAL INTERVAL( II )

FIG. 10

SCAN LINE DRIVER

CROSS-REFERENCE TO RELATED APPLICATION

This application claims priority under 35 U.S.C. §119 to Korean Patent Application No. 10-2015-0008529 filed on Jan. 19, 2015, in the Korean Intellectual Property Office (KIPO), the disclosure of which is hereby incorporated by reference herein in its entirety.

BACKGROUND

Field

The described technology generally relates to a display device, and more particularly, to a scan line driver.

Description of the Related Technology

The development of display devices is being directed towards higher performance and higher speeds. In particular, various circuits included in display devices are being actively researched and developed for higher performance.

SUMMARY OF CERTAIN INVENTIVE ASPECTS

One inventive aspect is a scan line driver having improved performance by providing a first driving signal and a second driving signal based on a set signal, a previous carry signal, a plurality of low level voltages and a plurality of clock signals having a plurality of logic low levels.

Another aspect is a scan line driver including a driving signal generation circuit, an output line driving circuit and a carry transfer circuit. The driving signal generation circuit provides a first driving signal and a second driving signal based on a set signal, a previous carry signal, a plurality of low level voltages and a plurality of clock signals. The set signal initializes a N-th scan line driver. The previous carry signal is provided from a (N−1)-th scan line driver. The low level voltages and the clock signals have a plurality of logic low levels. The output line driving circuit provides a scan line enable signal having a first logic low level of the logic low levels and a logic high level based on the first driving signal and the second driving signal. The carry transfer circuit provides a carry signal having a second logic low level of the logic low levels and the logic high level based on the first driving signal and the second driving signal.

The driving signal generation circuit can include a first boosting capacitor connected between a previous carry node and a first node. The previous carry signal can be provided to the previous carry node.

A first driving transistor among a plurality of driving transistors included in the driving signal generation circuit can be connected between a low level voltage having a third logic low level among the logic low levels and the first node.

When the set signal is the logic high level, the first driving transistor can be turned-on and the low level voltage having the third logic low level can be provided to the first node.

When the set signal is the logic high level and the clock signals are one of the logic low levels, a voltage between the previous carry node and the first node can be a delta voltage.

The delta voltage can be less than a threshold voltage of the driving transistors included in the driving signal generation circuit.

A second driving transistor and a third driving transistor of the driving transistors can be serially connected between a first clock node and a second driving node. A first clock signal having a first logic low level among the logic low levels can be provided to the first clock node. The second driving signal can be provided to the second driving node.

The second driving transistor can be driven based on a first clock signal having a third logic low level among the logic low levels. The third driving transistor can be driven based on a fourth clock signal having a third logic low level among the logic low levels.

When the set signal is a fourth logic low level among the logic low levels and the clock signals are the logic high level, the second driving node providing the second driving signal can be the logic high level.

A fourth driving transistor among the driving transistors can be connected between a previous carry node and a first driving node. The previous carry signal can be provided to the previous carry node. The first driving signal can be provided to the first driving node.

The fourth driving transistor can be driven based on a second clock signal having a third logic low level among the logic low levels.

When the set signal is a fourth logic low level among the logic low levels and the clock signals are the logic high level, the first driving node providing the first driving signal can be the logic high level.

After a set interval when the set signal is the logic high level and the clock signals are one of the logic low levels, an initial interval when the set signal is a fourth logic low level among the logic low levels and the clock signals are the logic high level can be performed.

The driving signal generation circuit can include a second boosting capacitor connected between a second driving node and a second node. The second driving signal can be provided to the second driving node.

A fifth driving transistor among a plurality of driving transistors included in the driving signal generation circuit can be connected between a low level voltage having a third logic low level among the logic low levels and the second node.

When the set signal is the logic high level, the fifth driving transistor can be turned-on and the low level voltage having the third logic low level can be provided to the second node.

When the set signal is the logic high level and the clock signals are one of the logic low levels, a voltage between the second driving node and the second node can be a delta voltage.

The output line driving circuit can provide one of a global clock signal having a first logic low level among the logic low levels and a third clock signal having the first logic low level as the scan line enable signal based on the first driving signal and the second driving signal.

The carry transfer circuit can provide one of a low level voltage having a second logic low level among the logic low levels and a third clock signal having the first logic low level as the carry signal based on the first driving signal and the second driving signal.

Another aspect is a scan line driver including a driving signal generation circuit, an output line driving circuit and a carry transfer circuit. The driving signal generation circuit provides a first driving signal and a second driving signal based on a set signal, a previous carry signal, a plurality of low level voltages a first clock signal and a second clock signal. The set signal initializes a N-th scan line driver. The previous carry signal is provided from a (N−1)-th scan line driver. The low level voltages, the first clock signal and the second clock signal have a plurality of logic low levels. The output line driving circuit provides a scan line enable signal having a first logic low level of the plurality of logic low levels and a logic high level based on the first driving signal and the second driving signal. The carry transfer circuit provides a carry signal having a second logic low level of the logic low levels and the logic high level based on the first driving signal and the second driving signal.

Another aspect is a scan line driver comprising a driving signal generation circuit configured to generate a first driving signal and a second driving signal based on: a set signal, a previous carry signal, a plurality of low level voltages and a plurality of clock signals, wherein the set signal is configured to initialize the driving signal generation circuit, wherein the driving signal generation circuit is further configured to receive the previous carry signal from a previous scan line driver, and wherein the low level voltages and the clock signals have a plurality of logic low levels; an output line driving circuit configured to generate a scan line enable signal based on the first driving signal and the second driving signal, wherein the scan line enable signal has a first logic low level and a logic high level; and a carry transfer circuit configured to generate a carry signal based on the first driving signal and the second driving signal, wherein the carry signal has a second logic low level and the logic high level.

In exemplary embodiments, the driving signal generation circuit includes a first boosting capacitor connected between a previous carry node and a first node and wherein the previous carry node is configured to receive the previous carry signal.

In exemplary embodiments, the driving signal generation circuit further includes a plurality of driving transistors including a first driving transistor, wherein the first driving transistor is connected between a low level voltage having a third logic low level and the first node.

In exemplary embodiments, when the set signal has the logic high level, i) the first driving transistor is configured to be turned-on and ii) the first node is configured to receive the low level voltage having the third logic low level.

In exemplary embodiments, when the set signal has the logic high level and the clock signals have at least one of the logic low levels, there is a voltage difference between the previous carry node and the first node.

In exemplary embodiments, the voltage difference is less than a threshold voltage of the driving transistors.

In exemplary embodiments, a second driving transistor and a third driving transistor are serially connected between a first clock node and a second driving node, wherein the first clock node is configured to receive a first clock signal having a first logic low level and wherein the second driving node is configured to receive the second driving signal.

In exemplary embodiments, the second driving transistor is configured to be driven based on a first clock signal having a third logic low level and wherein the third driving transistor is configured to be driven based on a fourth clock signal having the third logic low level.

In exemplary embodiments, when the set signal has a fourth logic low level and the clock signals have the logic high level, the second driving node is configured to generate the second driving signal having the logic high level.

In exemplary embodiments, a fourth driving transistor is connected between a previous carry node and a first driving node, wherein the previous carry node is configured to receive the previous carry signal, and wherein the first driving node is configured to receive the first driving signal.

In exemplary embodiments, the fourth driving transistor is configured to be driven based on a second clock signal having a third logic low level.

In exemplary embodiments, when the set signal has a fourth logic low level and the clock signals have the logic high level, the first driving node is configured to have the logic high level.

In exemplary embodiments, after a set interval when the set signal has the logic high level and the clock signals have one of the logic low levels, an initial interval is performed where the set signal has a fourth logic low level and the clock signals have the logic high level.

In exemplary embodiments, the driving signal generation circuit includes a second boosting capacitor connected between a second driving node and a second node and wherein the second driving node is configured to receive the second driving signal.

In exemplary embodiments, the driving signal generation circuit further includes a fifth driving transistor connected between a low level voltage having a third logic low level and the second node.

In exemplary embodiments, when the set signal is the logic high level, i) the fifth driving transistor is configured to be turned-on and ii) the second node is configured to receive the low level voltage having the third logic low level.

In exemplary embodiments, when the set signal is the logic high level and the clock signals are one of the logic low levels, there is a voltage difference between the second driving node and the second node, the output line driving circuit is further configured to generate one of: i) a global clock signal having a first logic low level and ii) a third clock signal having the first logic low level as the scan line enable signal based on the first driving signal and the second driving signal.

In exemplary embodiments, the carry transfer circuit is further configured to generate one of: i) a low level voltage having a second logic low level and ii) a third clock signal having the first logic low level as the carry signal based on the first driving signal and the second driving signal.

Another aspect is a scan line driver comprising a driving signal generation circuit configured to generate a first driving signal and a second driving signal based on: a set signal, a previous carry signal, a plurality of low level voltages a first clock signal and a second clock signal, wherein the set signal is configured to initialize the driving signal generation circuit, wherein the driving signal generation circuit is further configured to receive the previous carry signal from a previous scan line driver, and wherein the low level voltages, the first clock signal and the second clock signal have a plurality of logic low levels; an output line driving circuit configured to generate a scan line enable signal having a first logic low level and a logic high level based on the first driving signal and the second driving signal; and a carry transfer circuit configured to generate a carry signal having a second logic low level and the logic high level based on the first driving signal and the second driving signal.

According to at least one embodiment, the scan line driver has an improved performance by providing the first driving signal and the second driving signal based on the set signal, the previous carry signal, the low level voltages and the clock signals having the logic low levels.

BRIEF DESCRIPTION OF THE DRAWINGS

Example embodiments will be more clearly understood from the following detailed description taken in conjunction with the accompanying drawings.

FIG. 10 is a timing diagram illustrating a progressive operation interval of the scan line driver of FIG. 1.

DETAILED DESCRIPTION OF CERTAIN INVENTIVE EMBODIMENTS

Figure 1:
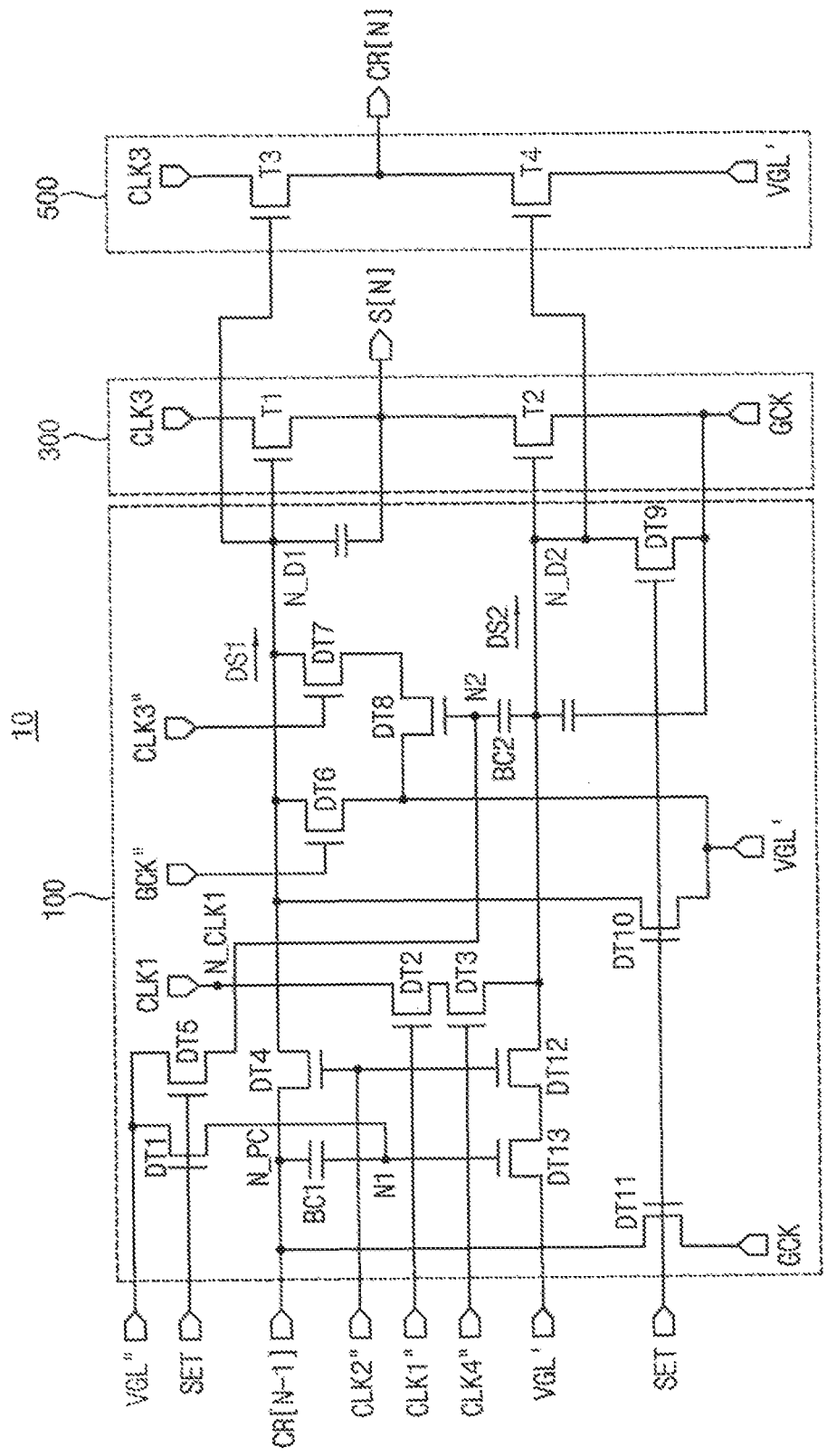
FIG. 1 is a circuit diagram illustrating a scan line driver according to example embodiments.

The example embodiments are described more fully hereinafter with reference to the accompanying drawings. Like or similar reference numerals refer to like or similar elements throughout.

Figure 2:
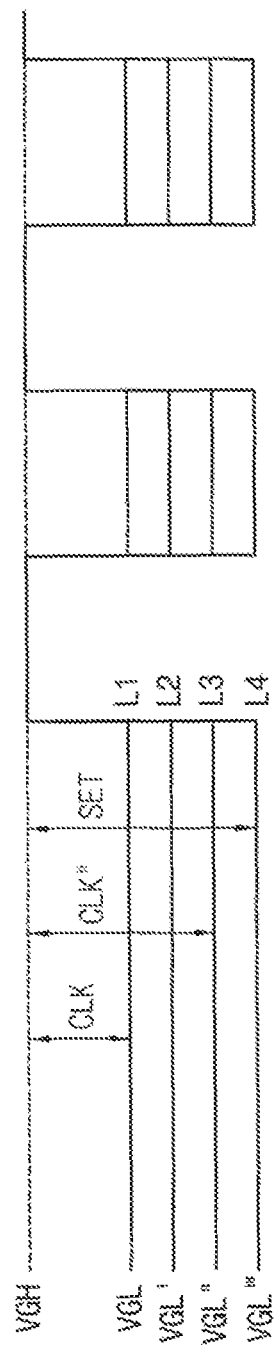
FIG. 2 is a diagram for describing a plurality of logic low levels that are provided to the scan line driver of FIG. 1.
Figure 3:
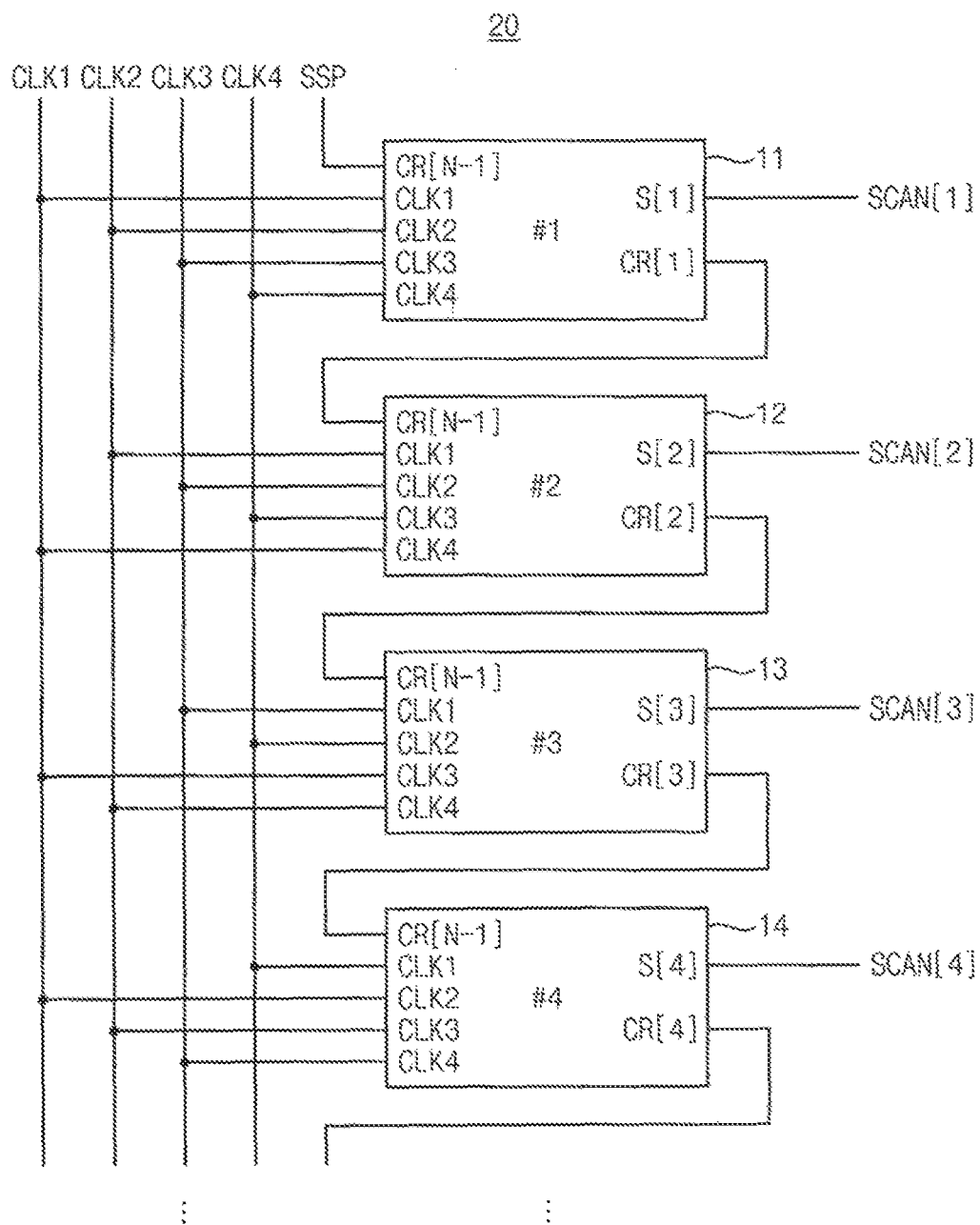
FIG. 3 is a block diagram illustrating a scan line driver device including the scan line driver of FIG. 1.

FIG. 1 is a circuit diagram illustrating a scan line driver according to example embodiments. FIG. 2 is a diagram for describing a plurality of logic low levels that are provided to the scan line driver of FIG. 1. FIG. 3 is a block diagram illustrating a scan line driver device including the scan line driver of FIG. 1.

Referring to FIGS. 1 to 3, a scan line driver 10 includes a driving signal generation circuit 100, an output line driving circuit 300 and a carry transfer circuit 500. For example, a scan line driver device 20 may include a first scan line driver 11, a second scan line driver 12, a third scan line driver 13 and a fourth scan line driver 14. The driving signal generation circuit 100 provides a first driving signal DS1 and a second driving signal DS2 based on a set signal SET, a previous carry signal CR[N−1], a plurality of low level voltages VGL, VGL', VGL", VGL''' and a plurality of clock signals CLK1 TO CLK1''', CLK2 TO CLK2''', CLK3 TO CLK3''', CLK4 TO CLK4'''. The set signal SET initializes a N-th scan line driver. The previous carry signal CR[N−1] is provided from an (N−1)-th scan line driver. The plurality of low level voltages and the plurality of clock signals have a plurality of logic low levels L1, L2, L3, and L4. For example, N may be a natural number that is greater than 2. When N=3, the previous carry signal CR[2] can be provided from the second scan line driver 12.

The logic low levels L1, L2, L3, L4 can be determined based on a threshold voltage VTH of transistors included in the scan line driver 10. For example, when the threshold voltage VTH of the transistors included in the scan line driver 10 is equal to −1V, a first logic low level L1 can be less than −1V. For example, when the first logic low level L1 is equal to about −2V, a second logic low level L2 can be equal to about −4V. In addition, when the second logic low level L2 is equal to about −4V, a third logic low level L3 can be equal to about −6V. In addition, when the third logic low level L3 is equal to about −6V, a fourth logic low level L4 can be equal to about −8V. In this embodiment, the voltage difference between the first logic low level L1 and the second logic low level L2 can be equal to about 2V, the voltage difference between the second logic low level L2 and the third logic low level L3 can be equal to about 2V and the voltage difference between the third logic low level L3 and the fourth logic low level L4 can be equal to about 2V.

For example, the clock signals having the logic low levels L1, L2, L3, L4 can include a first clock signal CLK1, a second clock signal CLK2, a third clock signal CLK3 and a fourth clock signal CLK4. The phase of the first clock signal CLK1 having the first logic low level L1 can be equal to the phase of the first clock signal CLK1" having the third logic low level L3. The amplitude of the logic low level of the first clock signal CLK1 having the first logic low level L1 can be different from the amplitude of the logic low level of the first clock signal CLK1" having the third logic low level L3. For example, the logic low level of the first clock signal CLK1 having the first logic low level L1 can be about −2V. The logic low level of the first clock signal CLK1" having the third logic low level L3 can be about −6V. In addition, the above description can be appropriately applied to the second clock signal CLK2, the third clock signal CLK3 and the fourth clock signal CLK4.

The output line driving circuit 300 provides a scan line enable signal S [N] having a first logic low level L1 and a logic high level based on the first driving signal DS1 and the second driving signal DS2. For example, the logic low level of the global clock signal GCK that is provided to the output line driving circuit 300 can be the first logic low level L1. In this embodiment, when the second driving signal DS2 is a logic high level, a second transistor T2 included in the output line driving circuit 300 is turned-on. When the second transistor T2 included in the output line driving circuit 300 is turned-on, the first logic low level L1 that is the logic low level of the global clock signal GCK is provided as the scan line enable signal S[N].

The carry transfer circuit 500 provides a carry signal CR[N] having a second logic low level L2 and the logic high level based on the first driving signal DS1 and the second driving signal DS2. For example, the logic low level of the low level voltage that is provided to the carry transfer circuit 500 can be the second logic low level L2. In this embodiment, when the second driving signal DS2 is a logic high level, a fourth transistor T4 included in the carry transfer circuit 500 is turned-on. When the fourth transistor T4 included in the carry transfer circuit 500 is turned-on, the second logic low level L2 that is the logic low level of the low level voltage is provided as the carry signal CR[N].

The scan line driver 10 according to example embodiments can have an improved performance by providing the first driving signal DS1 and the second driving signal DS2 based on the set signal SET, the previous carry signal CR[N-1], the low level voltages and the clock signals having the logic low levels L1, L2, L3, L4.

Figure 4:
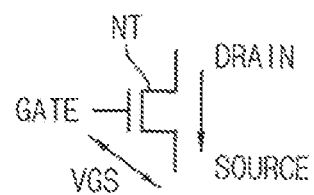
FIGS. 4 and 5 are diagrams for describing the logic low levels provided to the scan line driver of FIG. 1.
Figure 5:
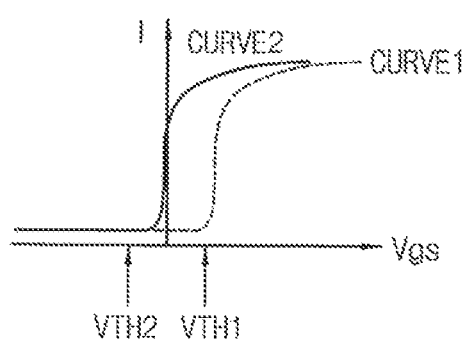

FIGS. 4 and 5 are diagrams for describing the logic low levels provided to the scan line driver of FIG. 1.

Referring to FIGS. 4 and 5, the first curve CURVE1 illustrates a current I according to a gate source voltage VGS in an ideal N-type metal-oxide-semiconductor (NMOS) transistor NT. The second curve CURVE2 illustrates the current I according to the gate source voltage VGS in a real NMOS transistor NT. When the NMOS transistor NT is ideal, the threshold voltage VTH of the NMOS transistor NT is a first threshold voltage VTH1. When the threshold voltage VTH of the NMOS transistor NT is the first threshold voltage VTH1 and the gate source voltage VGS is 0V, the NMOS transistor NT is turned-off. However, when the NMOS transistor NT is not ideal, the threshold voltage VTH of the NMOS transistor NT is a second threshold voltage VTH2. When the threshold voltage VTH of the NMOS transistor NT is the second threshold voltage VTH2 and the gate source voltage VGS is 0V, the NMOS transistor NT may be turned-on. Even though the gate source voltage VGS is 0V, when the NMOS transistor NT is not turned-off, the transistors included in the scan line driver 10 may not function as designed. Accordingly, a gate source voltage VGS of less than 0V may be required to turn-off the NMOS transistor NT. In other words, the voltage applied to the gate of the NMOS transistor NT may be required to be less than the voltage applied to the source or the drain of the NMOS transistor NT to turn-off the NMOS transistor NT. The logic low levels L1, L2, L3, L4 that are provided to the scan line driver 10 according to example embodiments can be used to fully turn-off the transistors included in the scan line driver 10.

Figure 6:
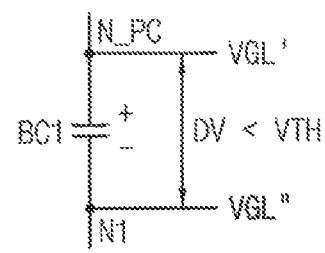
FIG. 6 is a diagram illustrating a first boosting capacitor included in the scan line driver of FIG. 1.

FIG. 6 is a diagram illustrating a first boosting capacitor included in the scan line driver of FIG. 1.

Referring to FIGS. 1 and 6, the driving signal generation circuit 100 includes a first boosting capacitor BC1 connected between a previous carry node N_PC and a first node N1. The previous carry signal CR[N-1] is provided to the previous carry node N_PC. In an example embodiment, a first driving transistor DT1 among a plurality of driving transistors DT1 TO DT13 included in the driving signal generation circuit 100 is connected between a low level voltage VGL" having a third logic low level L3 among the plurality of logic low levels and the first node N1. For example, when the set signal SET is the logic high level, the first driving transistor DT1 is turned-on and the low level voltage VGL" having the third logic low level L3 is provided to the first node N1.

In an example embodiment, when the set signal SET is the logic high level and the clock signals are one of the logic low levels, the voltage difference between the previous carry node N_PC and the first node N1 is a delta voltage DV. For example, the delta voltage DV can be less than a threshold voltage VTH of the driving transistors included in the driving signal generation circuit 100.

The logic low level of the low level voltage that is provided to the carry transfer circuit 500 can be a second logic low level L2. Thus, when the second driving signal DS2 is the logic high level, the fourth transistor T4 included in the carry transfer circuit 500 is turned-on. When the fourth transistor T4 included in the carry transfer circuit 500 is turned-on, the second logic low level L2 that is the logic low level of the low level voltage is provided as the carry signal CR[N]. In the same manner, the logic low level of the previous carry signal CR[N-1] that is provided to the previous carry node N_PC is the second logic low level L2.

The logic low level that is provided to a source of a thirteenth driving transistor DT13 can be the second logic low level L2. When the previous carry signal CR[N-1] is applied to a gate of the thirteenth driving transistor DT13 to drive the thirteenth driving transistor DT13, the gate source voltage of the thirteenth driving transistor DT13 can be 0V. When the gate source voltage VGS of the thirteenth driving transistor DT13 is 0V, the thirteenth driving transistor DT13 may be turned-on. Even though the gate source voltage of the thirteenth driving transistor DT13 is 0V, if the thirteenth driving transistor DT13 is turned-on, a malfunction may be generated in the scan line driver 10. Therefore, the gate source voltage of the thirteenth driving transistor DT13 can be less than 0V to prevent such a malfunction from occurring. The first boosting capacitor BC1 can be added between the previous carry node N_PC and the first node N1 such that the gate source voltage VGS of the thirteenth driving transistor DT13 is less than 0V. Accordingly, the logic low level that is provided to the gate of the thirteenth driving transistor DT13 can be the third logic low level L3. Thus, the gate source voltage VGS of the thirteenth driving transistor DT13 can be less than 0V. When the logic low level that is provided to the gate of the thirteenth driving transistor is the third logic low level L3, the thirteenth driving transistor DT13 is turned-off. For example, the first logic low level L1 is greater than the second logic low level L2. In addition, the second logic low level L2 is greater than the third logic low level L3. In addition, the third logic low level L3 is greater than the fourth logic low level L4.

In an example embodiment, a second driving transistor DT2 and a third driving transistor DT3 among the plurality of driving transistors DT1 TO DT13 are serially connected between a first clock node N_CLK1 and a second driving node N_D2. A first clock signal CLK1 having a first logic low level L1 among the plurality of logic low levels L1, L2, L3, L4 is provided to the first clock node N_CLK1. The second driving signal DS2 can be provided to the second driving node N_D2. For example, the second driving transistor DT2 can be driven based on a first clock signal CLK1" having a third logic low level L3. The third driving transistor DT3 can be driven based on a fourth clock signal CLK4" having a third logic low level L3.

The scan line driver 10 according to example embodiments can have improved performance by providing the first driving signal DS1 and the second driving signal DS2 based on the set signal SET, the previous carry signal CR[N-1], the low level voltages and the clock signals having the logic low levels.

Figure 7:
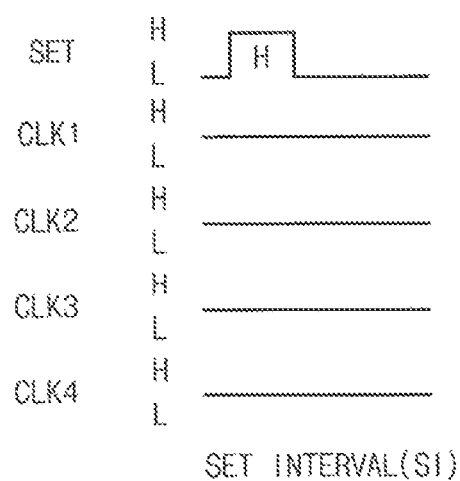
FIG. 7 is a timing diagram illustrating a set interval of the scan line driver of FIG. 1.

FIG. 7 is a timing diagram illustrating a set interval of the scan line driver of FIG. 1.

Referring to FIG. 7, when the set signal SET is the logic high level and the clock signals are one of the logic low levels, the voltage difference between the second driving node N_D2 and the second node N2 is a delta voltage DV. For example, a time interval when the set signal SET is the logic high level and the clock signals are one of the logic low levels is a set interval SI. When the set signal SET is the logic high level, the first driving transistor DT1 is turned-on. When the first driving transistor DT1 is turned-on, the low level voltage VGL" having the third logic low level L3 is provided to the first node N1. Accordingly, the first boosting capacitor BC1 is charged with the delta voltage DV. In the same manner, the second boosting capacitor BC2 can be charged.

Figure 8:
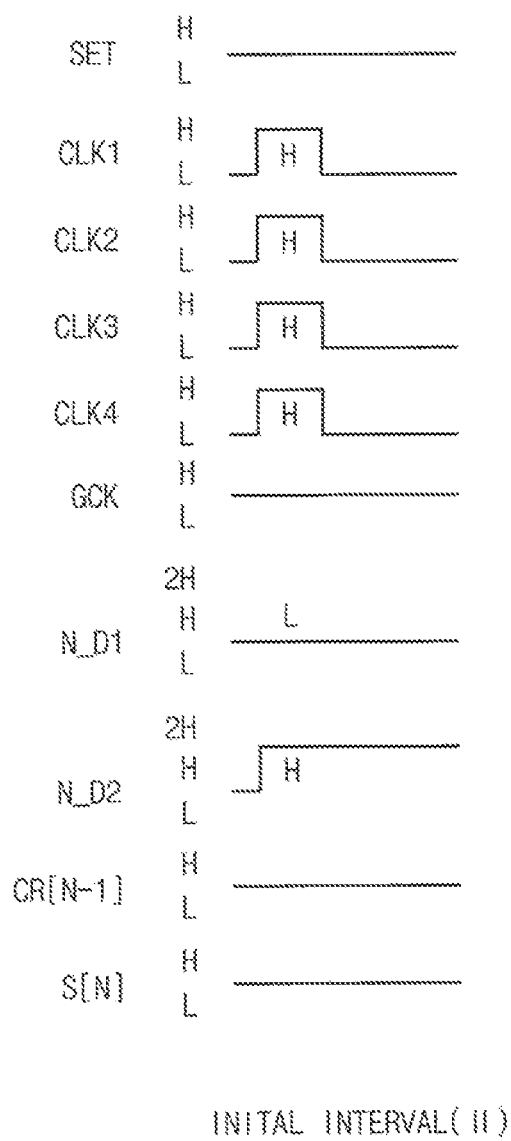
FIG. 8 is a timing diagram illustrating an initial interval of the scan line driver of FIG. 1.

FIG. 8 is a timing diagram illustrating an initial interval of the scan line driver of FIG. 1.

Referring to FIGS. 1 and 8, a fourth driving transistor DT4 among the plurality of driving transistors DT1 TO DT13 is connected between a previous carry node N_PC and a first driving node N_D1. The previous carry signal CR[N−1] can be provided to the previous carry node N_PC. The first driving signal DS1 can be provided to the first driving node N_D1.

When the set signal SET is a fourth logic low level L4 among the plurality of logic low levels L1, L2, L3, L4 and the clock signals are the logic high level, the first driving node N_D1 providing the first driving signal DS1 is the logic high level. For example, the time interval when the set signal SET is a fourth logic low level L4 and the clock signals are the logic high level is an initial interval II. For example, when the second clock signal CLK2" having the third logic low level L3 is logic high level, the fourth driving transistor DT4 is turned-on. When the fourth driving transistor DT4 is turned-on, the previous carry signal CR[N−1] is provided to the first driving node N_D1. When the previous carry signal CR[N−1] is the second logic low level L2, the first driving node N_D1 is the second logic low level L2.

In addition, when the first clock signal CLK1" having the third logic low level L3 is the logic high level, the second driving transistor DT2 is turned-on. When the fourth clock signal CLK4" having the third logic low level L3 is the logic high level, the third driving transistor DT3 is turned-on. When the second and third driving transistors DT2 and DT3 are turned-on, the first clock signal CLK1 having the first logic low level L1 is provided to the second driving node N_D2. When the first clock signal CLK1 having the first logic low level L1 is the logic high level, the second driving node N_D2 is the logic high level.

In an example embodiment, after a set interval SI when the set signal SET is the logic high level and the clock signals are one of the logic low levels, an initial interval II when the set signal SET is a fourth logic low level L4 and the clock signals are the logic high level is performed.

The scan line driver 10 according to example embodiments has an improved performance by providing the first driving signal DS1 and the second driving signal DS2 based on the set signal SET, the previous carry signal CR[N−1], the low level voltages and the clock signals having the logic low levels.

Figure 9:
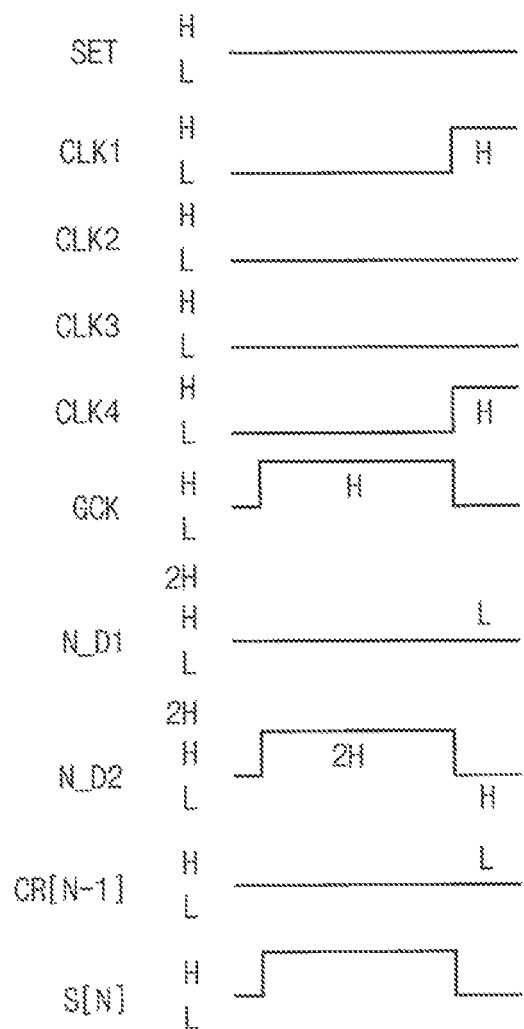
FIG. 9 is a timing diagram illustrating a simultaneous operation interval of the scan line driver of FIG. 1.
Figure 10:
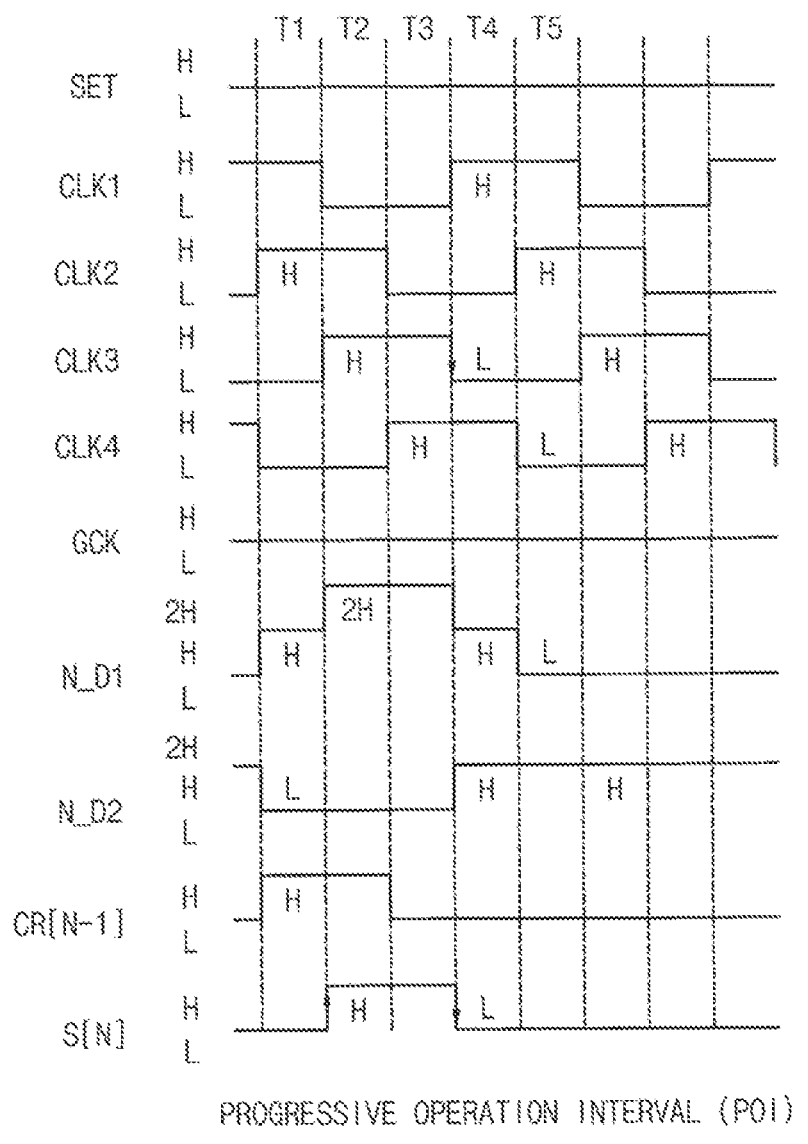

FIG. 9 is a timing diagram illustrating a simultaneous operation interval of the scan line driver 10 of FIG. 1. FIG. 10 is a timing diagram illustrating a progressive operation interval of the scan line driver 10 of FIG. 1.

Referring to FIGS. 9 and 10, after the set interval SI, the initial interval II can be performed. After the initial interval II, the simultaneous operation interval SOI and the progressive operation interval POI can be performed. For example, when the set signal SET, the first clock signal CLK1, the second clock signal CLK2, the third clock signal CLK3 and the fourth clock signal CLK4 are the logic low level and the global clock signal GCK is the logic high level, the first driving node N_D1 is the logic low level and the second driving node N_D2 is a second logic high level. When the second driving node N_D2 is the second logic high level, the second transistor is turned-on. When the second transistor is turned-on, the global clock signal GCK sets the scan line enable signal S [N]. Accordingly, the scan line enable signal S [N] is the logic high level because the global clock signal GCK is the logic high level. The time interval when the set signal SET, the first clock signal CLK1, the second clock signal CLK2, the third clock signal CLK3 and the fourth clock signal CLK4 are the logic low level and the global clock signal GCK is the logic high level is the simultaneous operation interval SOI.

After the simultaneous operation interval SOI, the progressive operation interval POI can be performed. For example, after the simultaneous operation interval SOI, the set signal SET is the logic low level, the previous carry signal CR[N−1], the first clock signal CLK1 and the second clock signal CLK2 are the logic high level and the third clock signal CLK3 and the fourth clock signal CLK4 are the logic low level in a first interval of the progressive operation interval POI. When the set signal SET is the logic low level, the previous carry signal CR[N−1], the first clock signal CLK1 and the second clock signal CLK2 are the logic high level and the third clock signal CLK3 and the fourth clock signal CLK4 are the logic low level in a first interval of the progressive operation interval POI, the first driving node N_D1 is the logic high level and the second driving node is the logic low level. When the first driving node N_D1 is the logic high level and the second driving node N_D2 is the logic low level, the scan line enable signal S[N] is the logic low level. In addition, the set signal SET is the logic low level, the previous carry signal CR[N−1], the second clock signal CLK2 and the third clock signal CLK3 are the logic high level and the first clock signal CLK1 and the fourth clock signal CLK4 are the logic low level in a second interval of the progressive operation interval POI. When the set signal SET is the logic low level, the previous carry signal CR[N−1], the second clock signal CLK2 and the third clock signal CLK3 are the logic high level and the first clock signal CLK1 and the fourth clock signal CLK4 are the logic low level in the second interval, the first driving node N_D1 is the logic high level and the second driving node is the logic low level. When the first driving node N_D1 is the logic high level and the second driving node N_D2 is the logic low level, the scan line enable signal S[N] is the logic high level.

The set signal SET is the logic low level, the previous carry signal CR[N−1], the first clock signal CLK1 and the second clock signal CLK2 are the logic low level and the third clock signal CLK3 and the fourth clock signal CLK4 are the logic high level in a third interval of the progressive operation interval POI. When the set signal SET is the logic low level, the previous carry signal CR[N−1], the first clock signal CLK1 and the second clock signal CLK2 are the logic low level and the third clock signal CLK3 and the fourth clock signal CLK4 are the logic high level in the third interval, the first driving node N_D1 is the logic high level and the second driving node N_D2 is the logic low level. When the first driving node N_D1 is the logic high level and the second driving node is the logic low level, the scan line enable signal S[N] are the logic high level.

In addition, the set signal SET is the logic low level, the previous carry signal CR[N−1], the second clock signal CLK2 and the third clock signal CLK3 are the logic low level and the first clock signal CLK1 and the fourth clock signal CLK4 are the logic high level in a fourth interval of the progressive operation interval POI. When the set signal SET is the logic low level, the previous carry signal CR[N−1], the second clock signal CLK2 and the third clock signal CLK3 are the logic low level and the first clock signal CLK1 and the fourth clock signal CLK4 are the logic high level in the fourth interval, the first driving node N_D1 is the logic high level and the second driving node is the logic high level. When the first driving node N_D1 is the logic high level and the second driving node N_D2 is the logic high level, the scan line enable signal S[N] is the logic low level.

In addition, the set signal SET is the logic low level, the previous carry signal CR[N−1], the third clock signal CLK3 and the fourth clock signal CLK4 are the logic low level and the first clock signal CLK1 and the second clock signal CLK2 are the logic high level in a fifth interval of the progressive operation interval POI. When the set signal SET is the logic low level, the previous carry signal CR[N−1], the third clock signal CLK3 and the fourth clock signal CLK4 are the logic low level and the first clock signal CLK1 and the second clock signal CLK2 are the logic high level in the fifth interval, the first driving node N_D1 is the logic low level and the second driving node is the logic high level. When the first driving node N_D1 is the logic low level and the second driving node N_D2 is the logic high level, the scan line enable signal S[N] is the logic low level.

The scan line driver 10 according to example embodiments has an improved performance by providing the first driving signal DS1 and the second driving signal DS2 based on the set signal SET, the previous carry signal CR[N−1], the low level voltages and the clock signals having the plurality of logic low levels L1, L2, L3, L4.

Figure 11:
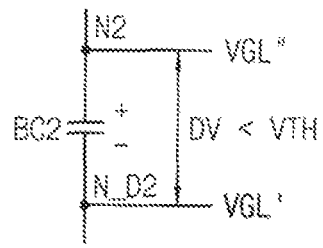
FIG. 11 is a diagram illustrating a second boosting capacitor included in the scan line driver of FIG. 1.

FIG. 11 is a diagram illustrating a second boosting capacitor included in the scan line driver of FIG. 1.

Referring to FIGS. 1 and 11, the driving signal generation circuit 100 includes a second boosting capacitor BC2 connected between a second driving node N_D2 and a second node N2. The second driving signal DS2 can be provided to the second driving node N_D2. In an example embodiment, a fifth driving transistor DT5 among a plurality of driving transistors DT1 TO DT13 included in the driving signal generation circuit 100 is connected between a low level voltage VGL" having a third logic low level L3 among the plurality of logic low levels L1, L2, L3, L4 and the second node N2. For example, when the set signal SET is the logic high level, the fifth driving transistor DT5 is turned-on and the low level voltage VGL" having the third logic low level L3 is provided to the second node N2.

In an example embodiment, when the set signal SET is the logic high level and the clock signals are one of the logic low levels, the voltage difference between the second driving node N_D2 and the second node N2 is a delta voltage DV. For example, the delta voltage DV can be less than a threshold voltage VTH of the driving transistors included in the driving signal generation circuit 100.

Figure 12:
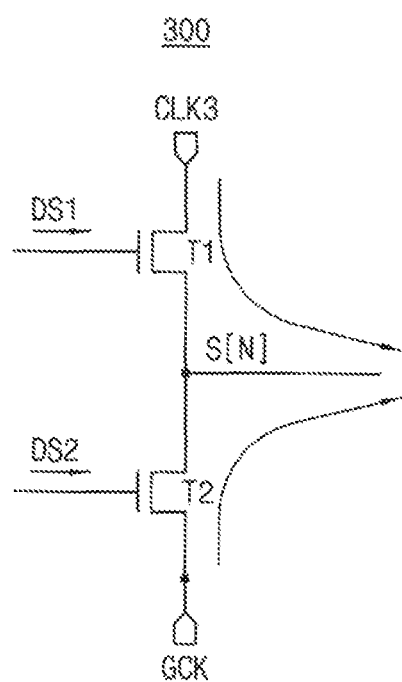
FIG. 12 is a diagram for describing an operation of an output line driving circuit included in the scan line driver of FIG. 1.

FIG. 12 is a diagram for describing an operation of an output line driving circuit included in the scan line driver of FIG. 1.

Referring to FIG. 12, the output line driving circuit 300 includes the first transistor T1 and the second transistor T2. The first driving signal DS1 is provided to the gate of the first transistor T1. When the first driving signal DS1 is the logic high level, the first transistor T1 is turned-on. When the first transistor T1 is turned-on, the third clock signal CLK3 is provided as the scan line enable signal S[N]. In addition, the second driving signal DS2 is provided to the gate of the second transistor T2. When the second driving signal DS2 is the logic high level, the second transistor T2 is turned-on. When the second transistor T2 is turned-on, the global clock signal GCK is provided as the scan line enable signal S[N]. In an example embodiment, the output line driving circuit 300 provides one of a global clock signal GCK having a first logic low level L1 among the plurality of logic low levels and a third clock signal CLK3 having the first logic low level L1 as the scan line enable signal based on the first driving signal DS1 and the second driving signal DS2.

The scan line driver 10 according to example embodiments has an improved performance by providing the first driving signal DS1 and the second driving signal DS2 based on the set signal SET, the previous carry signal CR[N−1], the low level voltages and the clock signals having the plurality of logic low levels.

Figure 13:
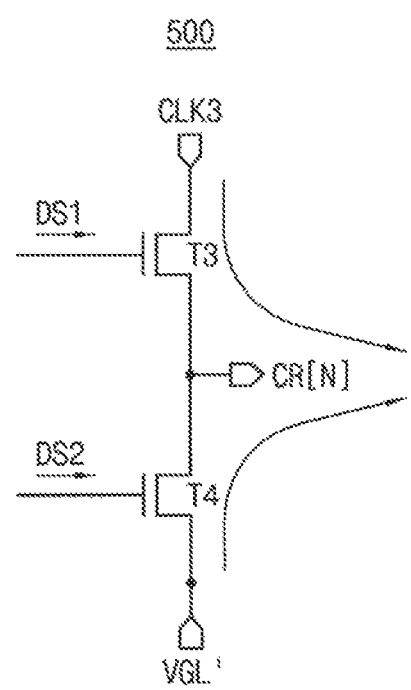
FIG. 13 is a diagram for describing an operation of a carry transfer circuit included in the scan line driver of FIG. 1.

FIG. 13 is a diagram for describing an operation of a carry transfer circuit included in the scan line driver of FIG. 1.

Referring to FIG. 13, the carry transfer circuit 500 includes the third transistor T3 and the fourth transistor T4. The first driving signal DS1 is provided to the gate of the third transistor T3. When the first driving signal DS1 is the logic high level, the third transistor T3 is turned-on. When the third transistor T3 is turned-on, the third clock signal CLK3 is provided as the carry signal CR[N]. In addition, the second driving signal DS2 is provided to the gate of the fourth transistor T4. When the second driving signal DS2 is the logic high level, the fourth transistor T4 is turned-on. When the fourth transistor T4 is turned-on, the low level voltage VGL' having the second logic low level L2 is provided as the carry signal CR[N]. In an example embodiment, the carry transfer circuit 500 provides one of a low level voltage VGL' having a second logic low level L2 and a third clock signal CLK3 having the first logic low level L1 as the carry signal CR[N] based on the first driving signal DS1 and the second driving signal DS2.

Figure 14:
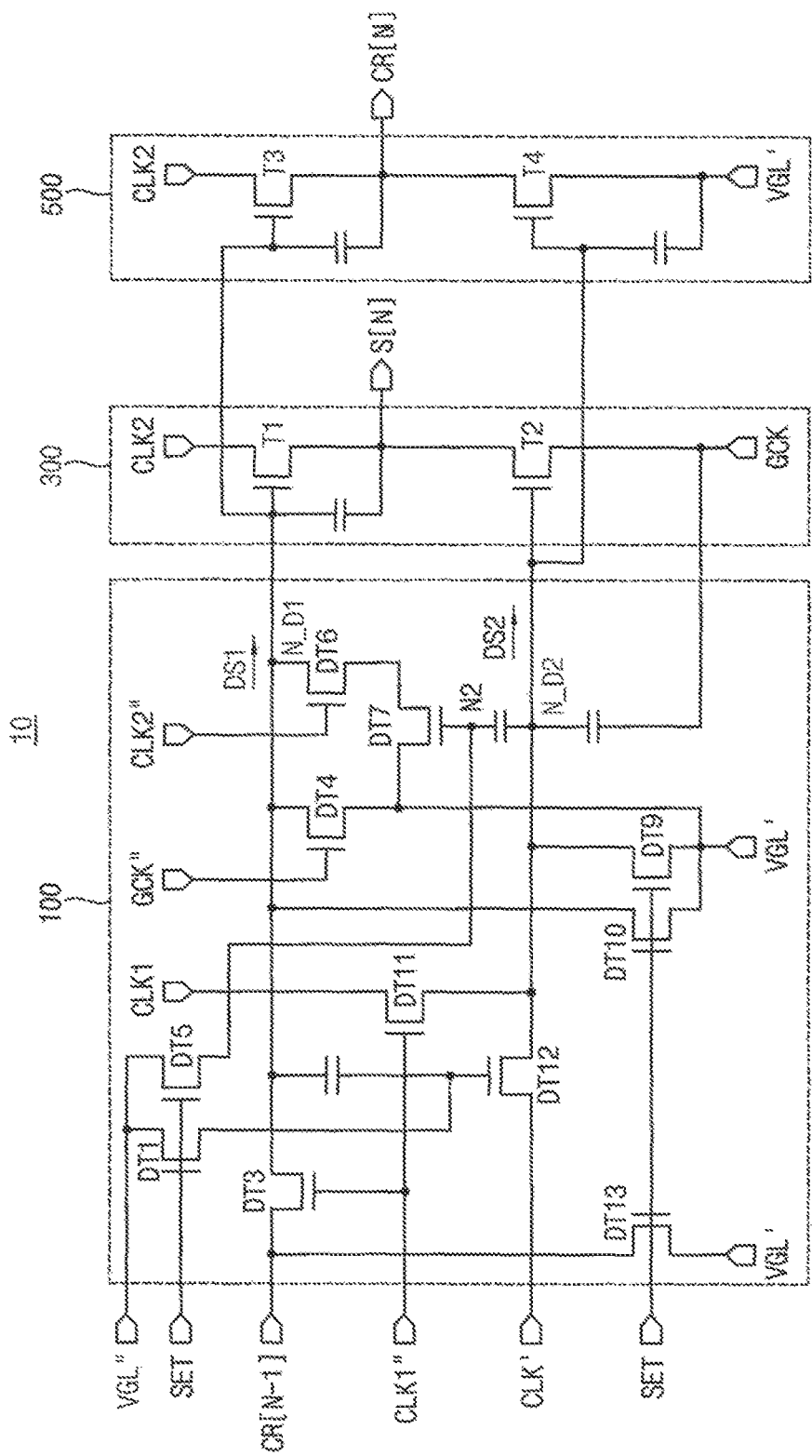
FIG. 14 is a circuit diagram illustrating a scan line driver according to example embodiments.

FIG. 14 is a circuit diagram illustrating a scan line driver according to example embodiments.

Referring to FIGS. 2, 3 and 14, a scan line driver 10 includes a driving signal generation circuit 100, an output line driving circuit 300 and a carry transfer circuit 500. The driving signal generation circuit 100 provides a first driving signal DS1 and a second driving signal DS2 based on a set signal SET, a previous carry signal CR[N−1], a plurality of low level voltages a first clock signal CLK1 and a second clock signal CLK2. The set signal SET initializes a N-th scan line driver. The previous carry signal CR[N−1] is provided from a (N−1)-th scan line driver. The low level voltages, the first clock signal CLK1 and the second clock signal CLK2 have a plurality of logic low levels L1, L2, L3, and L4. The output line driving circuit 300 provides a scan line enable signal S [N] having a first logic low level L1 and a logic high level based on the first driving signal DS1 and the second driving signal DS2. The carry transfer circuit 500 provides a carry signal CR[N] having a second logic low level L2 and the logic high level based on the first driving signal DS1 and the second driving signal DS2. The scan line driver 10 according to example embodiment has an improved performance by providing the first driving signal DS1 and the second driving signal DS2 based on the set signal SET, the previous carry signal CR[N−1], the low level voltages and the clock signals having the logic low levels. The scan line enable signal S[N] can be generated using 4 clock signals as shown in FIG. 1. The scan line enable signal S [N] can also be generated using 2 clock signals as shown in FIG. 14.

Figure 15:
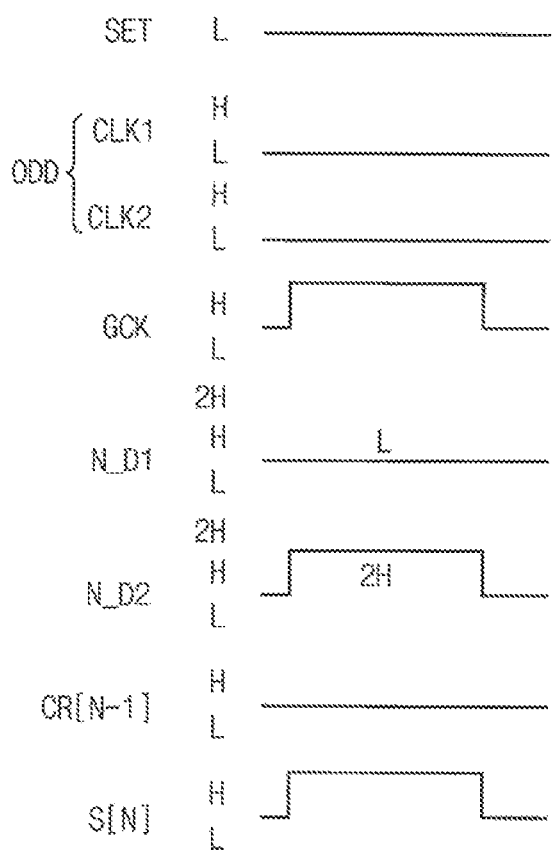
FIG. 15 is a timing diagram illustrating a simultaneous operation interval of the scan line driver of FIG. 14.
Figure 16:
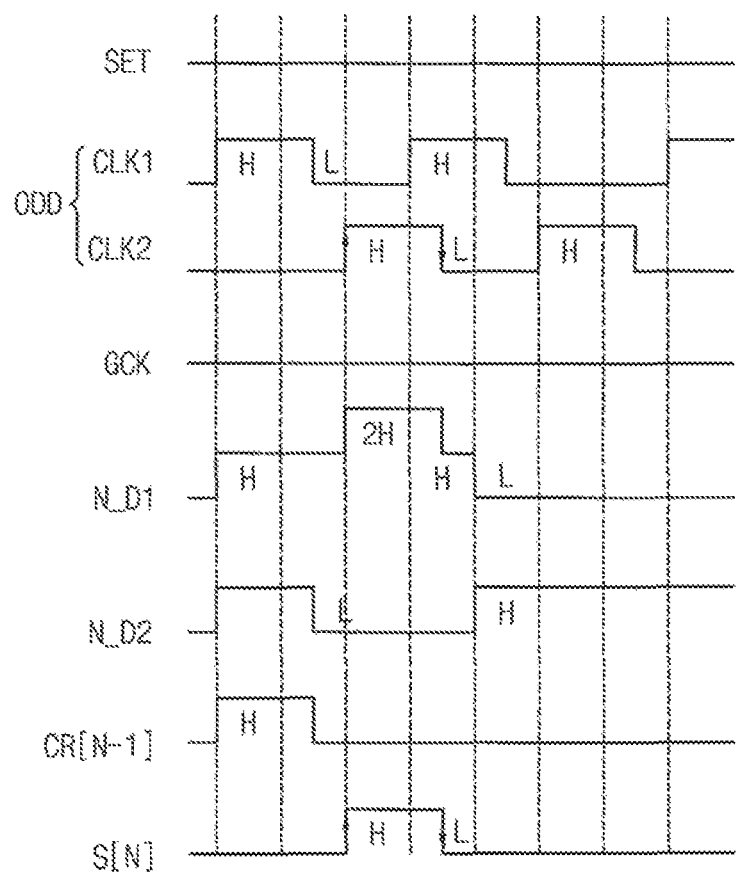
FIG. 16 is a timing diagram illustrating a progressive operation interval of the scan line driver of FIG. 14.
Figure 17:
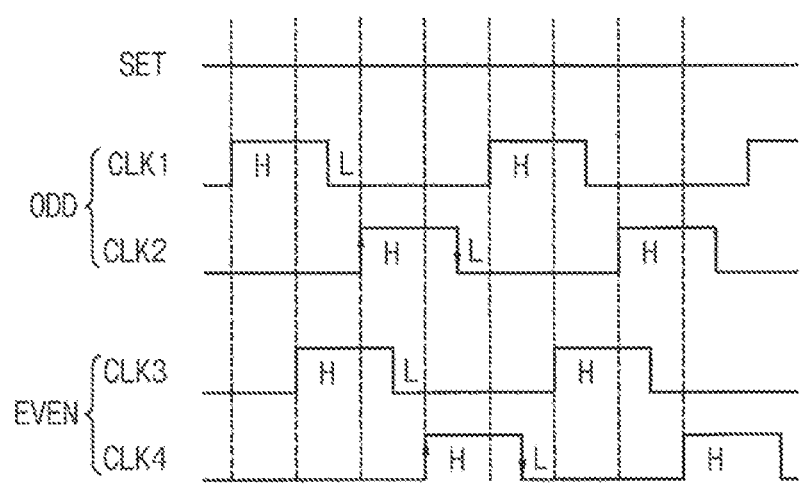
FIG. 17 is a diagram for describing clock signals that are provided to an odd number scan line driver and an even number scan line driver.

FIG. 15 is a timing diagram illustrating a simultaneous operation interval of the scan line driver of FIG. 14. FIG. 16 is a timing diagram illustrating a progressive operation interval POI of the scan line driver of FIG. 14. FIG. 17 is a diagram describing clock signals that are provided to an odd number scan line driver and an even number scan line driver.

Referring to FIGS. 7, 8 and 15 to 17, after a set interval SI when the set signal SET is the logic high level and the clock signals are one of the logic low levels L1, L2, L3, L4, an initial interval II when the set signal SET is a fourth logic low level L4 and the clock signals are the logic high level can be performed. After the initial interval II, the simultaneous operation interval SOI and the progressive operation interval POI can be performed. In the simultaneous operation interval SOI, when the set signal SET, the first clock signal CLK1 and the second clock signal CLK2 are the logic low level and the global clock signal GCK is the logic high level, the first driving node N_D1 is the logic low level and the second driving node N_D2 is the logic high level. When the first driving node N_D1 is the logic low level and the second driving node N_D2 is the logic high level, the second transistor T2 included in the output line driving circuit 300 turned-on. When the second transistor T2 included in the output line driving circuit 300 is turned-on, the global clock signal GCK is provided as the scan line enable signal S [N]. When the global clock signal GCK is the logic high level, the scan line enable signal S[N] is the logic high level.

In the progressive operation interval POI, after the first clock signal transitions from the logic high level to the logic low level, the second clock signal CLK2 transitions from the logic low level to the logic high level. When the second clock signal CLK2 transitions from the logic low level to the logic high level after the first clock signal transitions from the logic high level to the logic low level, the first driving node N_D1 is the logic high level and the second driving node N_D2 is the logic low level. When the first driving node N_D1 is the logic high level, the first transistor T1 included in the output line driving circuit 300 is turned-on. When the first transistor T1 included in the output line driving circuit 300 is turned-on, the second clock signal CLK2 is provided as the scan line enable signal S[N]. The progressive operation interval POI of the scan line driver device 20 can be performed by providing the first clock signal CLK1 and the second clock signal CLK2 to odd number scan line drivers 11, 13 among the scan line drivers 11, 12, 13, 14 included in the scan line driver device 20 and by providing the third clock signal CLK3 and the fourth clock signal CLK4 to even number scan line drivers 12, 14 among the scan line drivers 11, 12, 13, 14 included in the scan line driver device 20.

The scan line driver 10 according to example embodiments has an improved performance by providing the first driving signal DS1 and the second driving signal DS2 based on the set signal SET, the previous carry signal CR[N−1], the low level voltages and the clock signals having the logic low levels.

Figure 18:
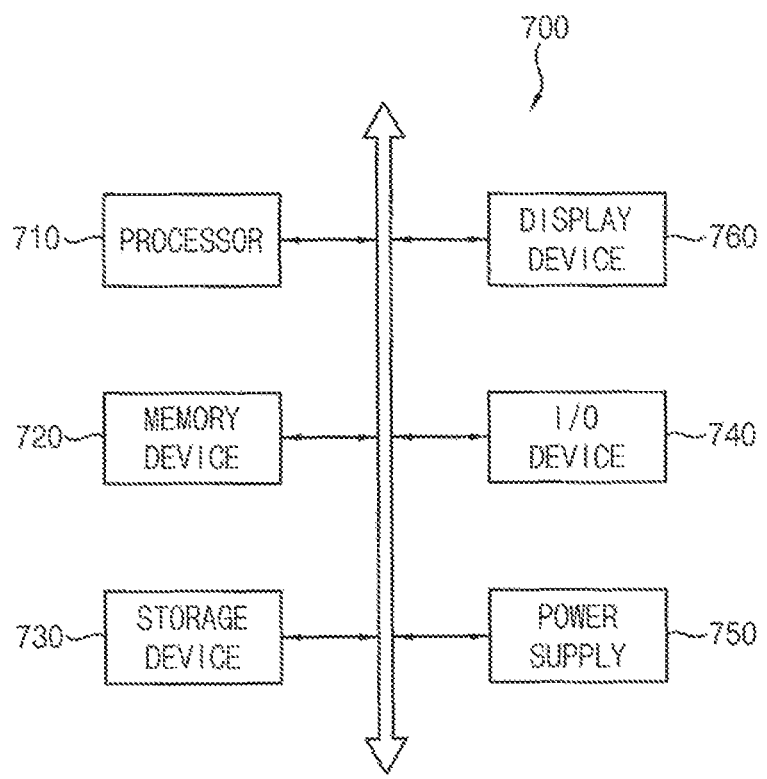
FIG. 18 is a block diagram illustrating a mobile device according to example embodiments.

FIG. 18 is a block diagram illustrating a mobile device according to example embodiments.

Referring to FIG. 18, a mobile device 700 includes a processor 710, a memory device 720, a storage device 730, an input/output (I/O) device 740, a power supply 750, and an electroluminescent display device 760. The mobile device 700 can further include a plurality of ports for communicating a video card, a sound card, a memory card, a universal serial bus (USB) device, or other electronic systems.

The processor 710 can perform various computing functions or tasks. The processor 710 can be for example, a microprocessor, a central processing unit (CPU), etc. The processor 710 can be connected to other components via an address bus, a control bus, a data bus, etc. Further, the processor 710 can be connected to an extended bus such as a peripheral component interconnection (PCI) bus.

The memory device 720 can store data for operations of the mobile device 700. For example, the memory device 720 can include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano-floating gate memory (NFGM) device, a polymer random access memory (PoRAM) device, a magnetic random access memory (MRAM) device, a ferroelectric random access memory (FRAM) device, and/or at least one volatile memory device such as a dynamic random access memory (DRAM) device, a static random access memory (SRAM) device, a mobile dynamic random access memory (mobile DRAM) device, etc.

The storage device 730 can be, for example, a solid state drive (SSD) device, a hard disk drive (HDD) device, a CD-ROM device, etc. The I/O device 740 can be, for example, an input device such as a keyboard, a keypad, a mouse, a touch screen, and/or an output device such as a printer, a speaker, etc. The power supply 750 can supply power for operating the mobile device 700. The electroluminescent display device 760 can communicate with other components via the buses or other communication links.

The present embodiments can be applied to any mobile device or any computing device. For example, the present embodiments can be applied to a cellular phone, a smart phone, a tablet computer, a personal digital assistant (PDA), a portable multimedia player (PMP), a digital camera, a music player, a portable game console, a navigation system, a video phone, a personal computer (PC), a server computer, a workstation, a tablet computer, a laptop computer, etc.

The scan line driver 10 according to example embodiments can have an improved performance by providing the first driving signal DS1 and the second driving signal DS2 based on the set signal SET, the previous carry signal CR[N−1], the low level voltages and the clock signals having the logic low levels.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive technology. Accordingly, all such modifications are intended to be included within the scope of the invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A scan line driver comprising:
 a driving signal generation circuit configured to generate a first driving signal and a second driving signal based on: a set signal, a previous carry signal, a plurality of low level voltages and a plurality of clock signals, wherein the set signal is configured to initialize the driving signal generation circuit, wherein the driving signal generation circuit is further configured to receive the previous carry signal from a previous scan line driver, wherein the low level voltages and the clock signals have a plurality of logic low levels, wherein the driving signal generation circuit includes a first boosting capacitor, connected between a previous carry node and a first node, and wherein the previous carry node is configured to receive the previous carry signal;
 an output line driving circuit configured to generate a scan line enable signal based on the first driving signal and the second driving signal, wherein the scan line enable signal has a first logic low level and a logic high level; and a carry transfer circuit configured to generate a carry signal based on the first driving signal and the second driving signal, wherein the carry signal has a second logic low level and the logic high level.

2. The scan line driver of claim 1, wherein the driving signal generation circuit further includes a plurality of driving transistors including a first driving transistor, wherein the first driving transistor is connected between a low level voltage having a third logic low level and the first node.

3. The scan line driver of claim 2, wherein when the set signal has the logic high level, i) the first driving transistor is configured to be turned-on and ii) the first node is configured to receive the low level voltage having the third logic low level.

4. The scan line driver of claim 3, wherein, when the set signal has the logic high level and the clock signals have at least one of the logic low levels, there is a voltage difference between the previous carry node and the first node.

5. The scan line driver of claim 4, wherein the voltage difference is less than a threshold voltage of the driving transistors.

6. The scan line driver of claim 1, wherein a second driving transistor and a third driving transistor are serially connected between a first clock node and a second driving node, wherein the first clock node is configured to receive a first clock signal having a first logic low level and wherein the second driving node is configured to receive the second driving signal.

7. The scan line driver of claim 6, wherein the second driving transistor is configured to be driven based on a first clock signal having a third logic low level and wherein the third driving transistor is configured to be driven based on a fourth clock signal having the third logic low level.

8. The scan line driver of claim 7, wherein, when the set signal has a fourth logic low level and the clock signals have the logic high level, the second driving node is configured to generate the second driving signal having the logic high level.

9. The scan line driver of claim 1, wherein a fourth driving transistor is connected between a previous carry node and a first driving node, wherein the previous carry node is configured to receive the previous carry signal, and wherein the first driving node is configured to receive the first driving signal.

10. The scan line driver of claim 9, wherein the fourth driving transistor is configured to be driven based on a second clock signal having a third logic low level.

11. The scan line driver of claim 10, wherein, when the set signal has a fourth logic low level and the clock signals have the logic high level, the first driving node is configured to have the logic high level.

12. The scan line driver of claim 9, wherein, after a set interval when the set signal has the logic high level and the clock signals have one of the logic low levels, an initial interval is performed where the set signal has a fourth logic low level and the clock signals have the logic high level.

13. The scan line driver of claim 1, wherein the driving signal generation circuit includes a second boosting capacitor connected between a second driving node and a second node and wherein the second driving node is configured to receive the second driving signal.

14. The scan line driver of claim 13, wherein the driving signal generation circuit further includes a fifth driving transistor connected between a low level voltage having a third logic low level and the second node.

15. The scan line driver of claim 14, wherein, when the set signal is the logic high level, i) the fifth driving transistor is configured to be turned-on and ii) the second node is configured to receive the low level voltage having the third logic low level.

16. The scan line driver of claim 15, wherein, when the set signal is the logic high level and the clock signals are one of the logic low levels, there is a voltage difference between the second driving node and the second node.

17. The scan line driver of claim 1, wherein the output line driving circuit is further configured to generate one of: i) a global clock signal having a first logic low level and ii) a third clock signal having the first logic low level as the scan line enable signal based on the first driving signal and the second driving signal.

18. The scan line driver of claim 17, wherein the carry transfer circuit is further configured to generate one of: i) a low level voltage having a second logic low level and ii) a third clock signal having the first logic low level as the carry signal based on the first driving signal and the second driving signal.

19. A scan line driver comprising:
a driving signal generation circuit configured to generate a first driving signal and a second driving signal based on: a set signal, a previous carry signal, a plurality of low level voltages a first clock signal and a second clock signal, wherein the set signal is configured to initialize the driving signal generation circuit, wherein the driving signal generation circuit is further configured to receive the previous carry signal from a previous scan line driver, and wherein the low level voltages, wherein the first clock signal and the second clock signal have a plurality of logic low levels, wherein the driving signal generation circuit includes a first boosting capacitor connected between a previous carry node and a first node, and wherein the previous carry node is configured to receive the previous carry signal;
an output line driving circuit configured to generate a scan line enable signal having a first logic low level and a logic high level based on the first driving signal and the second driving signal; and
a carry transfer circuit configured to generate a carry signal having a second logic low level and the logic high level based on the first driving signal and the second driving signal.

* * * * *